(12) United States Patent
Kwon et al.

(10) Patent No.: US 7,910,400 B2
(45) Date of Patent: Mar. 22, 2011

(54) QUANTUM DOT ELECTROLUMINESCENCE DEVICE AND METHOD OF FABRICATING THE SAME

(75) Inventors: Soon-jae Kwon, Gyeonggi-do (KR); Byoung-Iyong Choi, Gyeonggi-do (KR); Kyung-sang Cho, Gyeonggi-do (KR); Byung-ki Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/612,179

(22) Filed: Dec. 18, 2006

(65) Prior Publication Data

US 2007/0215856 A1 Sep. 20, 2007

(30) Foreign Application Priority Data

Feb. 16, 2006 (KR) ........................ 10-2006-0015159

(51) Int. Cl.
*H01L 21/20* (2006.01)

(52) U.S. Cl. ................. 438/99; 438/22; 438/46; 438/47; 257/E21.007

(58) Field of Classification Search .............. 257/40, 257/E21.007; 438/22, 46, 47, 99
See application file for complete search history.

(56) References Cited

U.S. PATENT DOCUMENTS

| | | | |
|---|---|---|---|
| 6,512,172 B1 * | 1/2003 | Salafsky et al. | 136/263 |
| 2004/0266148 A1 * | 12/2004 | Yim et al. | 438/497 |
| 2005/0001538 A1 * | 1/2005 | Ozkan et al. | 313/503 |
| 2005/0147739 A1 * | 7/2005 | Yamazaki et al. | 427/66 |
| 2005/0150541 A1 * | 7/2005 | Scher et al. | 136/250 |
| 2005/0239644 A1 * | 10/2005 | Zhu et al. | 502/350 |

OTHER PUBLICATIONS

Steckel, 1.3 to 1.55 micrometer tunable electroluminescence from PbSe quantum dots embeded within an organic device, Adv. Mater. 15, 2003, 1862-1866.*
Hu, Characterization and Surface Charge Measurement of Self-Assembled CdS Nanoparticle Films, Chem. Mater. 10, 1998, 1160-1165.*
Guyot-Sionnest et al., Fast Voltammetric and Electrochromic Response of Semiconductor Nanocrystal Thin Films, J. Phys. Chem. B107, pp. 7355-7359, 2003.*
Papadimitrakopoulos (Synthetic Materials, 85, 1997, pp. 1221-1224), environmental stability of Alq3 and its implications in lihgt emitting devices.*

* cited by examiner

*Primary Examiner* — Kiesha R Bryant
*Assistant Examiner* — Minchul Yang
(74) *Attorney, Agent, or Firm* — Cantor Colburn LLP

(57) ABSTRACT

A quantum dot electroluminescence device and a method of fabricating the same are provided. The quantum dot electroluminescence device comprises an insulating substrate; a quantum dot luminescence layer supported by the insulating substrate, and composed of a monolayer or multilayer of quantum dots, which are cross-linked by a cross-link agent; an anode electrode and a cathode electrode connected to an external power supply to inject carriers to the quantum dot luminescence layer; a hole transfer layer interposed between the anode electrode and the quantum dot luminescence layer, and composed of p-type polymer semiconductor; and an electron transfer layer interposed between the cathode electrode and the quantum dot luminescence layer, and composed of metal oxide or n-type polymer semiconductor.

7 Claims, 13 Drawing Sheets

FIG. 5
(a)
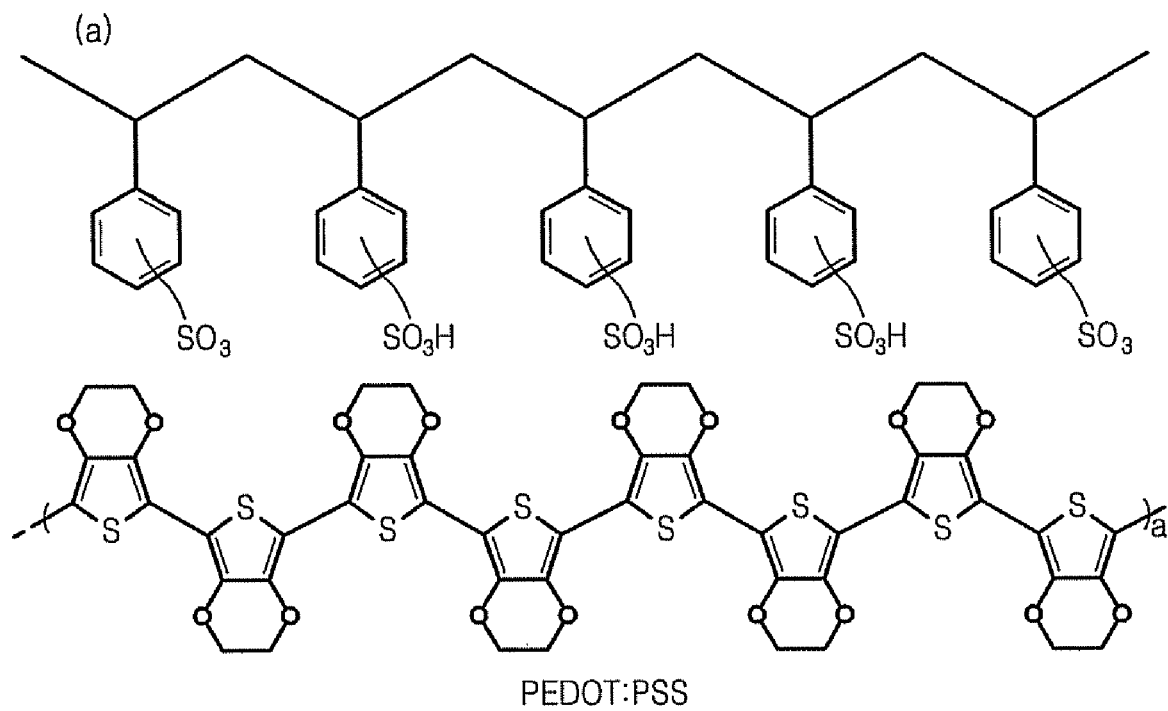
PEDOT:PSS
(b)
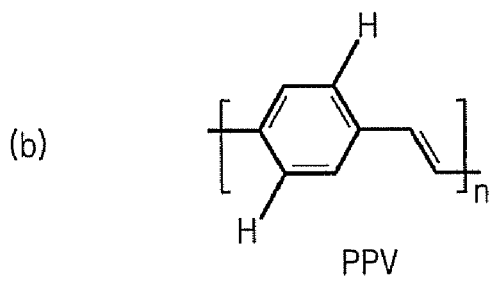
PPV
(c)
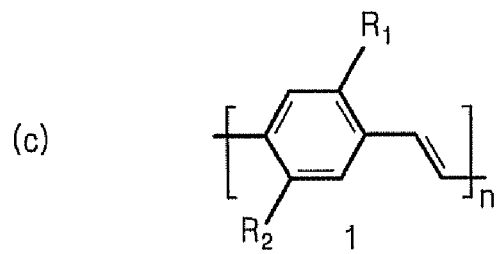
$R_1 = OMe, R_2 = OCH_2CH(C_2H_5)(C_4H_9)$
MEH-PPV
(d)
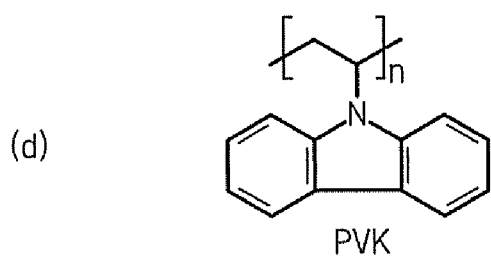
PVK

FIG. 6
(a) 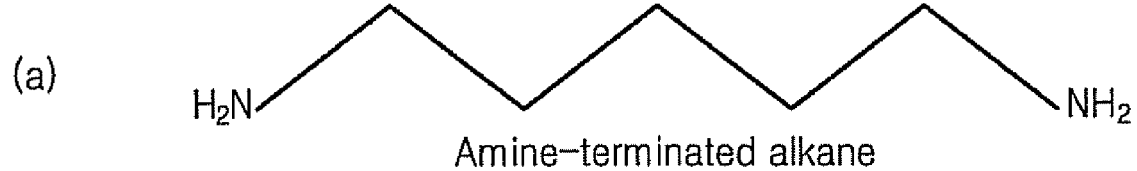
Amine-terminated alkane
(b) 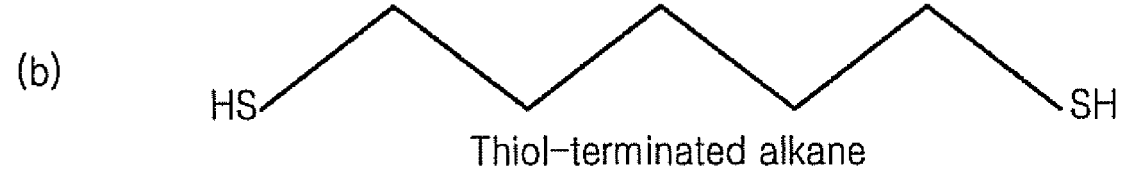
Thiol-terminated alkane
(c) 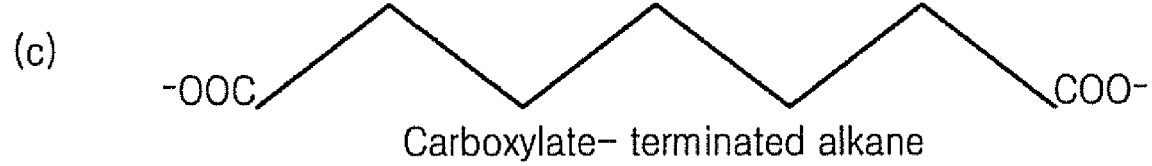
Carboxylate- terminated alkane

QUANTUM DOT ELECTROLUMINESCENCE DEVICE AND METHOD OF FABRICATING THE SAME

CROSS-REFERENCE TO RELATED PATENT APPLICATION

This application claims the benefit of Korean Patent Application No. 10-2006-0015159, filed on Feb. 16, 2006, in the Korean Intellectual Property Office, the contents of which are hereby incorporated in their entirety.

BACKGROUND OF THE INVENTION

1. Field of the Invention

The present invention relates to a quantum dot electroluminescence device and a method of fabricating the same. The present invention also relates to a quantum dot electroluminescence device using a quantum dot thin film in which a plurality of quantum dots are arranged in two-dimensions, and a method of fabricating the same.

2. Description of the Related Art

A conventional organic light emitting device (OLED) generally has a multilayered thin film structure composed of a low-molecular organic material. While the conventional OLED has advantages of various materials selectable for a thin film, easy formation of a high purity thin film, and a high luminescence function, it has problems with oxidation or crystallization as a result of reactions with foreign harmful materials. Further, since it is formed at a predetermined position using a vacuum evaporation, it has a problem of requiring a complicated and high-cost film formation process.

Recently, studies of luminescence devices using the luminescence characteristics of quantum dots were conducted. Normally, in the quantum dot electroluminescence device, a low-molecular weight organic material, which has been used in OLEDs such as $Alq_3$, is formed on a luminescence layer using vacuum evaporation. The low molecular weight organic material functions as an electron transfer layer. Since the thin film composed of the organic material reacts with harmful materials such as oxygen or moisture, originally amorphous thin film may become recrystallized or oxidized. As a result, dark spots are often generated on the thin film with a loss of the display function. The luminescence device also loses efficiency and deteriorates as a result of this undesirable reaction with oxygen and moisture.

In order to prevent such deterioration, and maintain the display function, it is desirable to protect the organic thin film from harmful materials, and a plurality of shield layers have been required to seal the organic thin film. Thus, additional thin film formation processes are used. The shield structure uses vacuum evaporation requiring expensive vacuum evaporation equipment, skillful technology, and a plurality of processing steps, and therefore increases the manufacturing costs of electroluminescence devices.

There is also a quantum dot electroluminescence device that comprises the electron transfer layer composed of n-GaN and a hole transfer layer which is used along with the electron transfer layer and is composed of p-GaN. However, since the n-GaN material layer formed on the quantum dot luminescence layer is formed using vacuum evaporation, complicated manufacturing processes and large-sized manufacturing systems are used. Thus the problem of high-expensive manufacturing costs still remains. Therefore, limitations of technology and economical problems still exist in employing the technology for large-area luminescence devices, and the quantum dot thin film may be damaged during the evaporation process maintained at a temperature of about 300° C., and particularly, there occurs a problem that a luminescence efficiency is low.

FIG. 1 is a photograph illustrating a section of a conventional quantum dot thin film examined using a transmission electron microscopes (TEM), and FIG. 2 is a sectional view illustrating the alignment state of quantum dots in the conventional quantum dot thin film of FIG. 1. As shown in the drawings, when an interface 51 of a quantum dot luminescence layer 50 is examined under a microscope, the interface 51 does not have an even surface and is formed rough due to limitations in the manufacturing processes. More specifically, the quantum dot luminescence layer 50 composed of quantum dots 50a cannot be formed on the entire surface of the substrate 10 with a uniform thickness, but forms a monolayer or multilayer locally depending upon their positions. This disposition produces voids where the quantum dots do not partially exist. A hole transfer layer 30 and an electron transfer layer 70 disposed on and below the quantum dot luminescence layer 50 contact each other directly at the voids, and generate a micro-short. This combination of holes and electrons injected through an anode electrode 20 and a cathode electrode (not shown) are recombined at the voids so as to locally generate large current. Thus, the generation of a useless leakage current, which does not pass through the quantum dots 50a and which does not contribute to luminescence operation, causes a loss of power consumption., The operation efficiency of the luminescence device is deteriorated, and neighboring thin film structures are deteriorated due to the electric heating effect.

SUMMARY OF THE INVENTION

The present invention provides a quantum dot electroluminescence device and a method of fabricating the same by directly employing a wet thin film formation process on a quantum dot thin film, thereby simplifying the fabrication processes and saving fabrication costs.

The present invention also provides a quantum dot electroluminescence device and a method of fabricating the same by forming the interface of a quantum dot luminescence layer with a high uniformity, and enhancing the binding force of quantum dots, thereby improving an operating efficiency.

The present invention also provides a quantum dot electroluminescence device and a method of fabricating the same by preventing deterioration of a display function due to foreign harmful materials, and maintaining a low turn-on voltage.

According to an aspect of the present invention, there is provided a quantum dot electroluminescence device comprising an insulating substrate; a quantum dot luminescence layer supported by the insulating substrate, and composed of a monolayer or multilayer of quantum dots, which are cross-linked by a cross-link agent; an anode electrode and a cathode electrode connected to an external power supply to inject carriers to the quantum dot luminescence layer; a hole transfer layer interposed between the anode electrode and the quantum dot luminescence layer, and composed of p-type polymer semiconductor; and an electron transfer layer interposed between the cathode electrode and the quantum dot luminescence layer, and composed of metal oxide or n-type polymer semiconductor.

According to another aspect of the present invention, there is provided a method of fabricating a quantum dot electroluminescence device comprising forming an anode electrode on an insulating substrate; forming a hole transfer layer composed of p-type polymer semiconductor on the anode electrode; two-dimensionally arraying synthesized quantum dots on the hole transfer layer to form a quantum dot luminescence layer; applying a cross-link agent to the quantum dot luminescence layer so as to cross-link the quantum dots; performing a wet chemical process on the quantum dot luminescence layer so as to form an electron transfer layer; and forming a cathode electrode on the organic electron transfer layer.

BRIEF DESCRIPTION OF THE DRAWINGS

The above and other features and advantages of the present invention will become more apparent by describing in detail exemplary embodiments with reference to the attached drawings in which:

FIGS. 5A through 5D are exemplary schematic views illustrating chemical structures of various polymeric materials employed in a hole transfer layer of the present invention;

FIGS. 6A through 6C are exemplary schematic views illustrating chemical structures of various chain organic molecules employed as cross-link agents of the present invention;

DETAILED DESCRIPTION OF THE INVENTION

Figure 3:
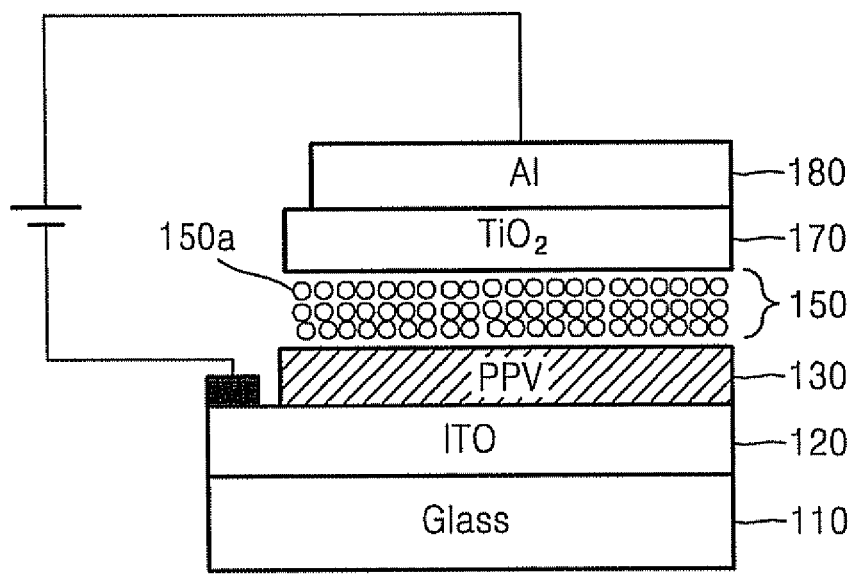
FIG. 3 is an exemplary sectional view of a quantum dot electroluminescence device according to an embodiment of the present invention.

Hereinafter, a quantum dot electroluminescence device and a method of fabricating the same will be explained in detail with reference to the accompanying drawings. FIG. 3 is an exemplary sectional view of a quantum dot electroluminescence device according to an embodiment of the present invention, and FIGS. 4A through 4F illustrate processes of a method of fabricating the quantum dot electroluminescence device of FIG. 3 in accordance with processing sequences. Referring to FIG. 3, the electroluminescence device includes insulating substrate 110 as a support element, a quantum dot luminescence layer 150 formed on the insulating substrate 110, and a first electrode 120 and a second electrode 180 connected to an external supply power to supply charge carriers to the quantum dot luminescence layer 150. The insulating substrate 110 may use transparent glass, or a translucent plastic substrate that is flexible such as polyethylene terephthalate, polybutylene terephthalate, polymethylmethacrylate, polystyrene or polycarbonate. When employing a bottom-emission type insulating substrate, for example, a transparent glass may be preferably used.

With reference once again to the FIG. 3 and FIG. 4A, the first electrode 120 acting as an anode is formed on the insulating substrate 110. The first electrode 120 is preferably composed of a material having a high work function for allowing hole injection, and for example, in the case of a bottom-emission type, Indium Tin Oxide (ITO) as an oxide of Indium-Tin may be used for a transparent material. A second electrode 180, which is used along with the first electrode 120, functions as a cathode, and may be composed of a metal material having a low work function, such as Al, Mg, Ca, and the like. The first electrode 120 may be formed on the insulating substrate 110 using a sputtering, and the second electrode 180 may be formed on preceding layers using a vacuum evaporation (see FIG. 4F).

Figure 4:
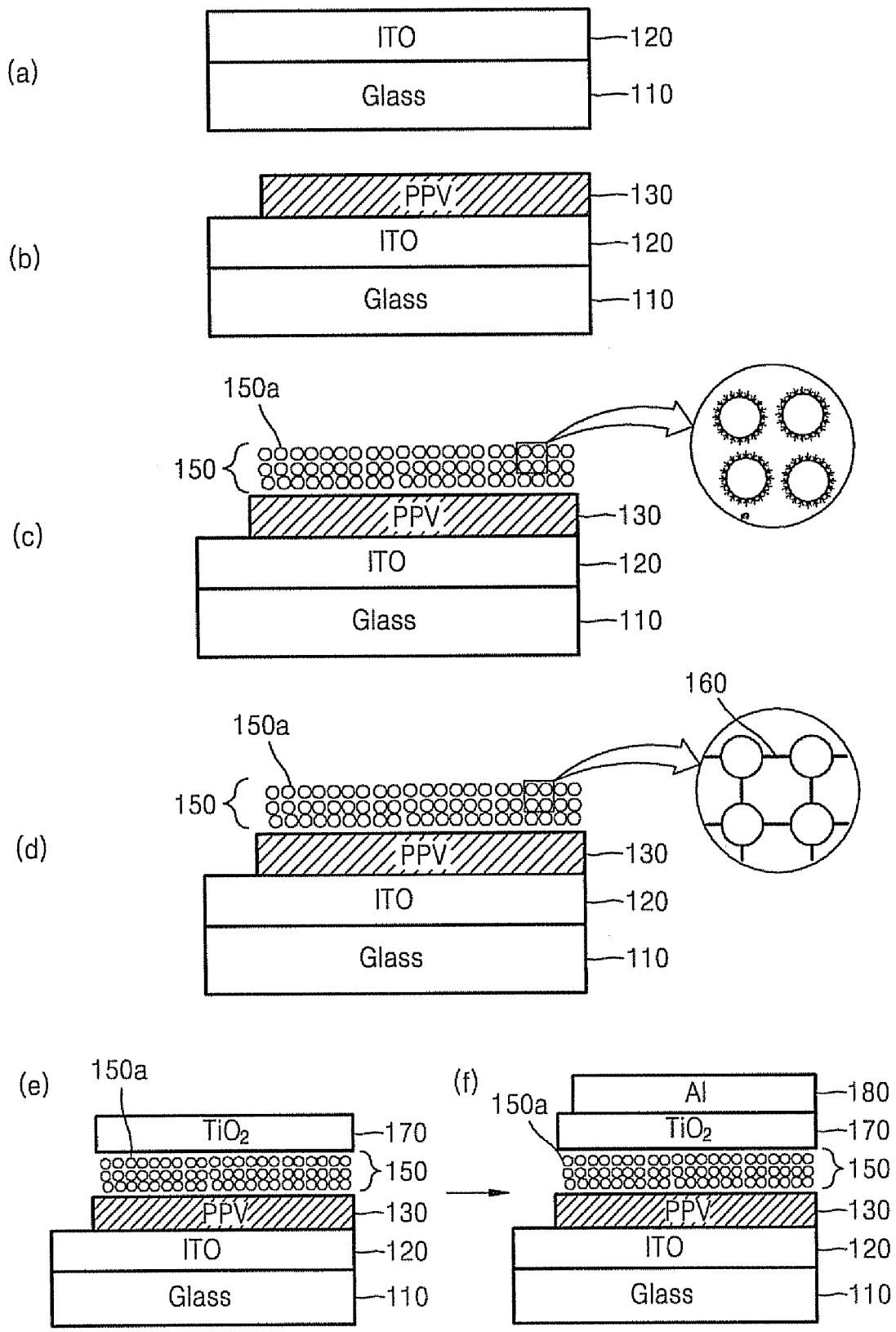
FIGS. 4A through 4F are exemplary sectional views of processes illustrating a method of fabricating the quantum dot electroluminescence device of FIG. 3 in accordance with processing sequences.

As shown in FIG. 4B, a hole transport layer (HTL) 130 is formed on the first electrode 120. The HTL 130 of the present invention is composed of a p-type semiconductive polymer, and more specifically, may employ polymer such as PEDOT (Poly(3,4-ethylenedioxythiophene)), PSS (poly(4-styrenesulfonate)), PPV (poly(p-phenylene vinylenes)), MEH-PPV, PVK (poly(9-vinlycarbazole)), or a combination comprising at least one of the foregoing p-type semiconductive polymer. FIGS. 5A through 5D schematically illustrate chemical structures of a mixture of PEDOT and PSS (PEDOT:PSS), PPV, MEH-PPV, and PVK.

The HTL 130 functions to increase an endurance period of the electroluminescence device, and decrease the turn-on voltage (also known as the starting voltage) of the electroluminescence device. Particularly, the HTL 130 of the polymer material has relatively robust characteristics with respect to noxious substances such as oxygen, moisture, and the like, compared with that of low-molecular organic materials used in other commercially available devices. It also has a high resistivity to crystallization. For example, when forming a PPV polymer layer on the first electrode 120, a precursor solution including PPV precursor polymer and methanol organic solution is disposed on the first electrode 120 using a spin-coating, and preferably, thermal-treatment is performed for 3 hours at a curing temperature of 250 to 300° C. under the atmosphere of $N_2$ inert gas or vacuum ambient, so as to form the HTL 130 composed of a PPV thin film.

The quantum dot luminescence layer 150 is formed of a monolayer or a multilayer, in which a plurality of quantum dots 150a are arranged. The quantum dot 150a defines a particle having a predetermined size, influenced by a quantum confinement effect, and has a diameter of about 1 nanometer (nm) through 10 nm. The quantum dot 150a may be formed using a wet chemical process, which is a method of supplying a precursor material into an organic solution and growing particles. The wet chemical process has an advantage of controlling the growth of nano particles by an easier and less expensive process than a vapor deposition method such as metal organic chemical deposition (MOCVD) or molecular beam epitaxy (MBE) since the organic solution is naturally coordinated on the surface of quantum dot crystals when the crystal is grown, and functions as a dispersion agent so as to control the growth of the crystal. By controlling the size of the quantum dot 150a, the energy band gap can be controlled to produce light having various wavelengths, that is, light ranging from visible rays region and from blue color rays to ultraviolet rays region.

More specifically, the quantum dot 150a is composed of II-VI group semiconductor compound, and may comprise at least one semiconductor compound selected from the group consisting of CdSe, CdTe, CdS, ZnSe, ZnTe, ZnS, InP, GaP, $GaInP_2$ or Cu-doped and Mn-doped CdSe, CdTe, CdS, ZnSe, ZnTe, ZnS, InP, GaP, and $GaInP_2$. The quantum dot 150a may have a homogeneous single structure or a core-shell double structure. In the case of the core-shell double structure, the materials forming the core and shell may be composed of different semiconductor compound materials selected from the group consisting of CdSe, CdTe, CdS, ZnSe, ZnTe, ZnS, InP, GaP, and $GaInP_2$. However, the energy band gap of the shell material is preferably greater than the energy band gap of the core material. For example, when manufacturing a quantum dot having a CdSe/ZnS core/shell structure, a precursor material such as $(CH_3)_2Cd$ (dimethyl cadmium), TOPSe (trioctylphosphine selenide) is supplied to form the core (CdSe). These materials are dispersed into an organic solvent using trioctylphosphine oxide (TOPO) as a surfactant, so as to form a crystal that is maintained at a high temperature for a predetermined time such that the crystal is grown to a desired size. Then, a precursor material to form the shell (ZnS) is supplied to form the shell on the surface of the core, so as to provide a CdSe/ZnS quantum dot capped with trioctylphosphine oxide (TOPO). The quantum dot luminescence layer 150 is formed by arranging the quantum dots 150a formed as described above or by spin coating, dip coating, printing, spray coating, the substrate in a colloidal solution containing the quantum dots.

As shown in the enlarged view of FIG. 4C, since the quantum dots 150a formed by the wet chemical process are surrounded by the surfactant, the quantum dot luminescence layer 150 composed of their arrays may be easily dissolved by an organic solvent. Thus, in the present invention as shown in FIG. 4D, a post treatment is performed using a cross-link agent 160 after forming the quantum dot luminescence layer 150, in order to provide chemical stability to the quantum dot luminescence layer 150. That is, the quantum dot luminescence layer 150 achieved by the wet chemical process is supplied into the solution having the cross-link agent 160 and after a predetermined time, it is heated in an inert gas. At this time, the cross-link agent 160 cross-link the neighboring quantum dots 150a, and binds them. Thus, because of the use of the cross-link agent 160, the dissolution of the quantum dot luminescence layer 150 by organic solvents is minimized. The cross-link agent 160 may use polymeric organic molecules having functional groups at both ends of the polymer chain, and for example, may use 1,7-diaminoheptane of diaminoalkanes. As shown in FIG. 6A, the 1,7-diaminoheptane has amine functional group (—$NH_2$) at both ends of the chain, and the functional group couples with neighboring quantum dots 150a, and connect them with each other. Thus, the mechanical and chemical stability of the quantum dot luminescence layer 150 can be ensured. For example, when the quantum dot luminescence layer 150 is immersed into the solution including 1,7-diaminoheptane and methanol solvent for 10 to 30 minutes, cross-linking occurs between the quantum dots 150a. Another example of the cross-link agent 160 is a dithiol having a thiol functional group (—SH) at both ends of the polymer chain, and dicarboxylate having a carboxyl functional group (—COO—) at both ends of the chain as shown in FIGS. 6B and 6C.

In the meantime, since the stability of the quantum dot luminescence layer 150 is improved, various processes including a thermal treatment process in addition to the wet chemical process can be selectively employed in order to improve the characteristics of the thin films if necessary. Further, when the quantum dots 150a of the quantum dot luminescence layer 150 are coupled with each other, the quantum dots 150a may be closely packed, and when forming a multilayered quantum dot luminescence layer 150. A binding force between layers can be enhanced by removing a large amount of surfactant molecules that exist between the quantum dots 150a, and planarizing the surface of each layer. The injection of the charge carriers can be easily accomplished by closely packing the quantum dots 150a, and as a result, a turn-on voltage can be decreased, and an operating stability can be ensured.

Figure 1:
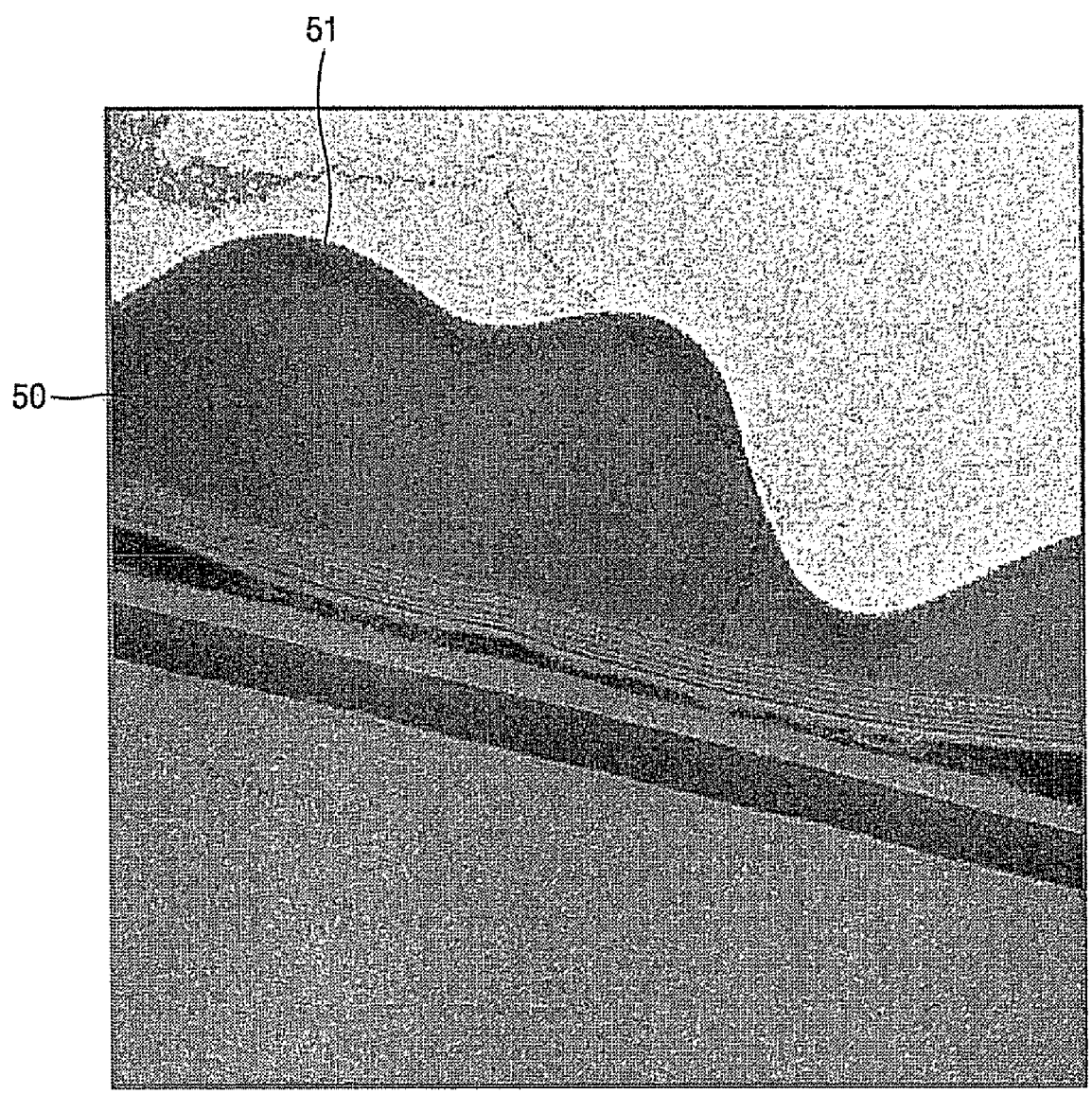
FIG. 1 is a photograph illustrating the section of a conventional quantum dot thin film examined using a transmission electron microscopes (TEM)
Figure 2:
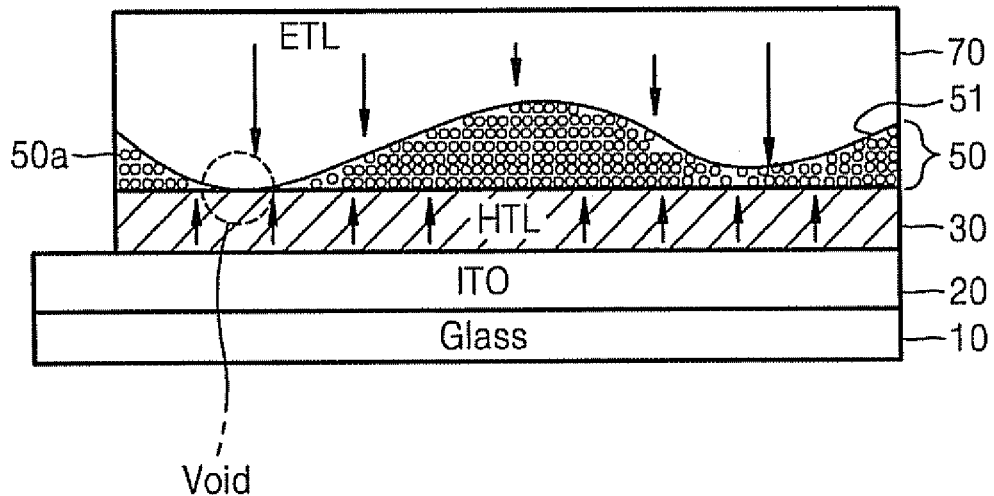
FIG. 2 is an exemplary sectional view illustrating the alignment state of quantum dots in the conventional quantum dot thin film of FIG. 1.
Figure 7:
FIG. 7 is a photograph illustrating a section of a quantum dot thin film after treating with a cross-link agent examined using a TEM.

FIG. 7 is a cross-sectional TEM micrograph of a quantum dot luminescence layer, and illustrates that when applying the cross-link agent described as above to the quantum dot luminescence layer, quantum dots are cross-linked and the uniformity of thickness of the thin film is improved. In the example, the quantum dot luminescence layer is maintained with a uniform thickness of about 12 nm. The conventional quantum dot luminescence layer illustrated in FIG. 2 cannot be formed with a uniform thickness on the entire surface of the substrate due to the limitation of manufacturing processes, and the quantum dot luminescence layer partially generates voids in which the quantum dots do not exist. Further, the arrays of the quantum dots of the monolayer or multilayer are not uniform, and thus, consumption power of the display device is lost due to the leakage current through the voids. In the present invention, an additional effect of improving the thickness uniformity of the quantum dot luminescence layer in addition to the effect of improving the chemical stability of the quantum dot luminescence layer can be ensured by treating the quantum dot luminescence layer by using the cross-link agent. Thus, the void defect generated during the arrangement of the quantum dots can be removed, and a luminescence level and an operating efficiency can be improved.

As illustrated in FIG. 4E, an electron transfer layer (ETL) 170 is formed on the quantum dot luminescence layer 150. Various materials to form the ETL 170 can be selected, such as, for example, an inorganic material including a metal oxide such as $TiO_2$, $ZrO_2$ or n-type semiconductor polymer. In one preferable embodiment of the present invention, the ETL 170 may be composed of amorphous $TiO_2$, and can be achieved by a simple wet chemical process to be explained later. That is, a precursor solution of organo-titanate including an organic solvent and oxide material is provided by spin-casting, and a more specific example of the precursor solution may be n-butyl titanate, n-propyl titanate, ethyl titanate, isopropyl titanate, isobutyl titanate, n-butyl titanate polymer, and the like. Since the quantum dots 150a to form the quantum dot luminescence layer 150 are cross-linked by the cross-link agent 160, even though the quantum dot luminescence layer 150 is coated with an organic solvent, for example, butanol solvent thereon, the quantum dot luminescence layer 150 is not dissolved by the organic solvent. After the deposition of the precursor solution, a curing process is performed, for example, the deposited precursor solution is heated at a temperature of 100 to 150° C. for 30 to 60 minutes under the atmosphere, so as to achieve the ETL 170 composed of a $TiO_2$ thin film. Here, when the ETL 170 is composed of $ZrO_2$, organo-zirconate used as the precursor solution may be n-butyl zirconate, n-propyl zirconate, and the like.

In the present invention, since the ETL 170 is composed of an inorganic material or polymer instead of low-molecular weight organic material vulnerable to harmful materials such as moisture or oxygen, the deterioration of the electroluminescence device due to oxidation or corrosion can be prevented. In addition, the turn-on voltage of the electroluminescence device can be maintained as low as that of the conventional organic light emitting device (OLED).

Figure 8A:
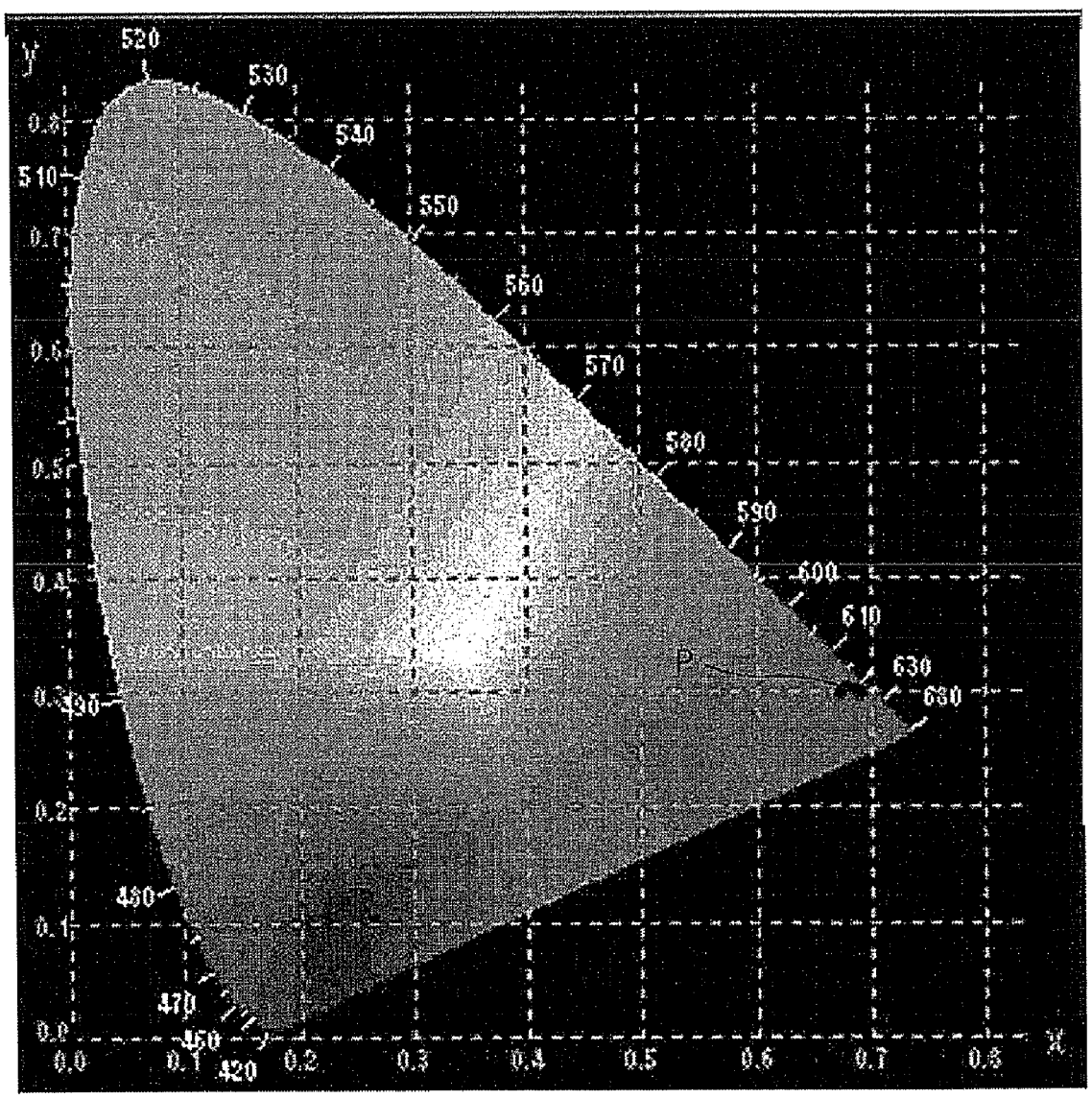
FIGS. 8A through 8E are views illustrating luminescence characteristics of an electroluminescence device according to an embodiment of the present invention.

FIGS. 8A through 8E are views illustrating luminescence characteristics of an electroluminescence device according to an embodiment of the present invention, in which a first electrode/hole transfer layer/quantum dot luminescence layer/electron transfer layer/second electrode are formed as ITO/PEDOT/CdSe-ZnS(core-shell)/TiO$_2$/Al. FIG. 8A is a color coordinate to examine the color components of the light radiated from the quantum dots. In the color coordinates, an upper region represents a green component, a lower left region represents a blue component, and a lower right region represents a red component. As shown in the drawing, most of the light radiated from the quantum dot includes the red component, and more specifically, it includes most the red component indicated by one point P in the red region.

Figure 8B:
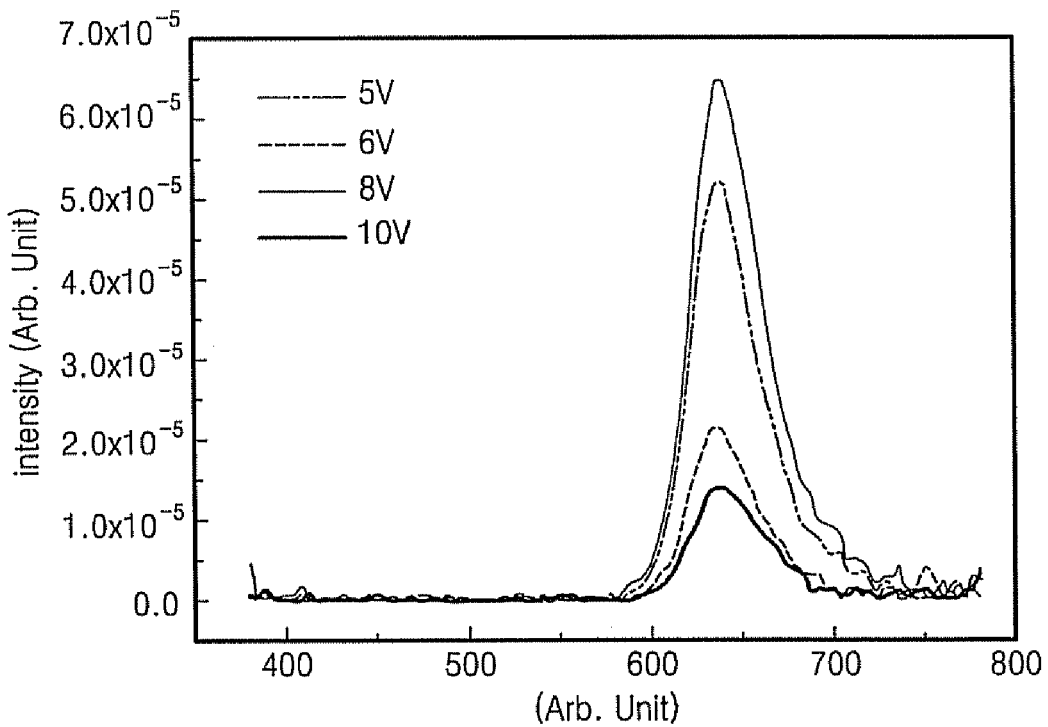

FIG. 8B is a luminescence spectrum illustrating a luminescence intensity in accordance with wavelength radiated from the quantum dot, and has a peak intensity in the red wavelength. The luminescence intensity of wavelength other than the red wavelength is close to zero (0) for different driving bias voltages of 5V, 6V, 8V, and 10V. From the result, the luminescence device using the quantum dot of the present invention may extract monochromatic light of a specific wavelength with a high impurity, and may achieve pixel arrangement for full-color by arranging the quantum dots of red, green, and blue colors sequentially in a predetermined order.

Figure 8C:
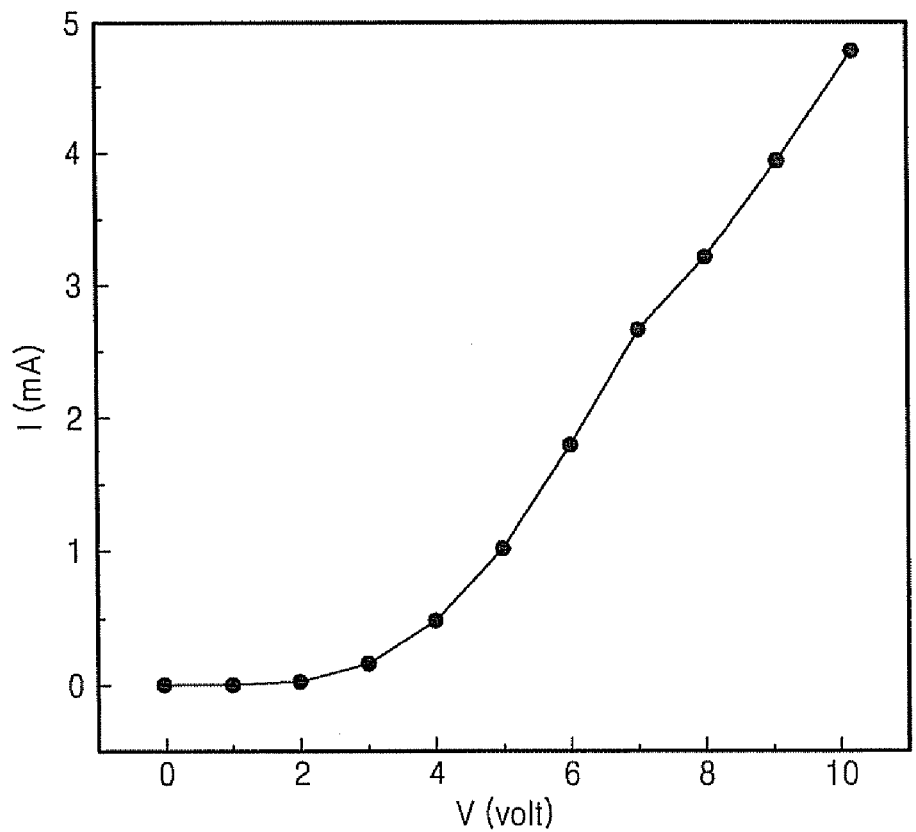

FIG. 8C is a view (IN curve) illustrating voltage-current characteristics of the luminescence device. Referring to the drawing, when current is rapidly increased by the recombination of electron-hole at the turn-on voltage of about 4V or higher, light of a predetermined wavelength corresponding to an energy band gap is radiated, and for example, about 650 nm wavelength of red light is produced at a turn-on voltage of 4V or higher. Thus, the luminescence device of the present invention shows luminescence characteristics at a low direct current of several volts, and does not show the phenomenon highly sensitive to moisture/oxygen, which has been typically shown in the conventional OLED.

Figure 8D:
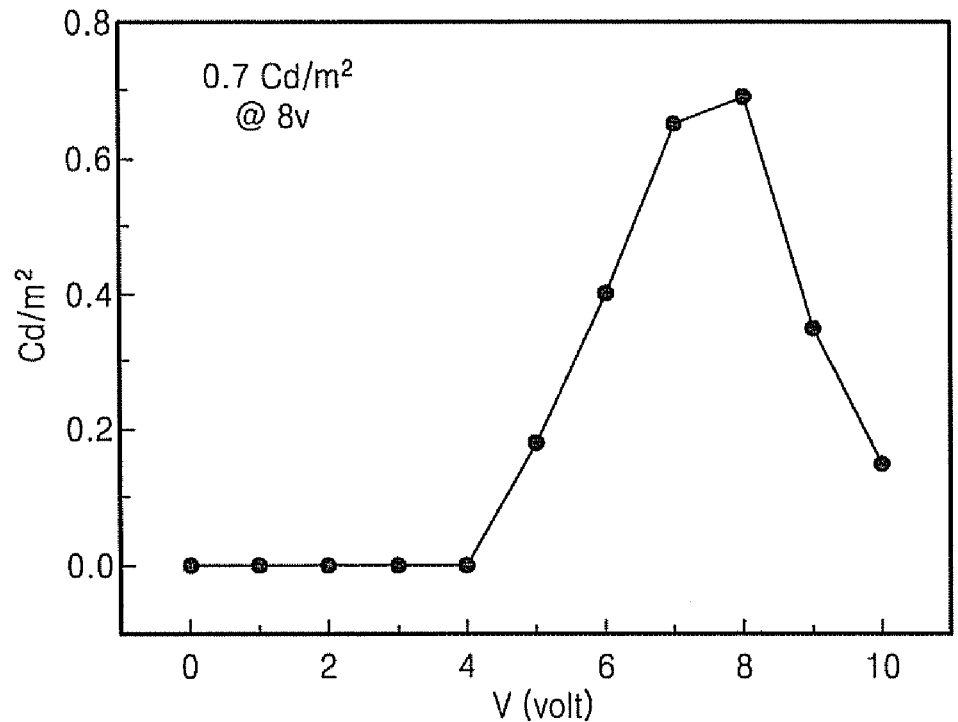

FIG. 8d illustrates a profile of a luminescence brightness in accordance with bias voltage applied to the luminescence device. Mostly, in the shape similar to the voltage-current characteristics illustrated in FIG. 8C, radiation does not occur at a voltage lower than the turn-on voltage, but the luminescence brightness is rapidly increased at a voltage higher than the turn-on voltage. When about 8V of bias voltage is applied, about 0.7 Cd/m$^2$ maximum luminescence brightness is produced.

Figure 8E:
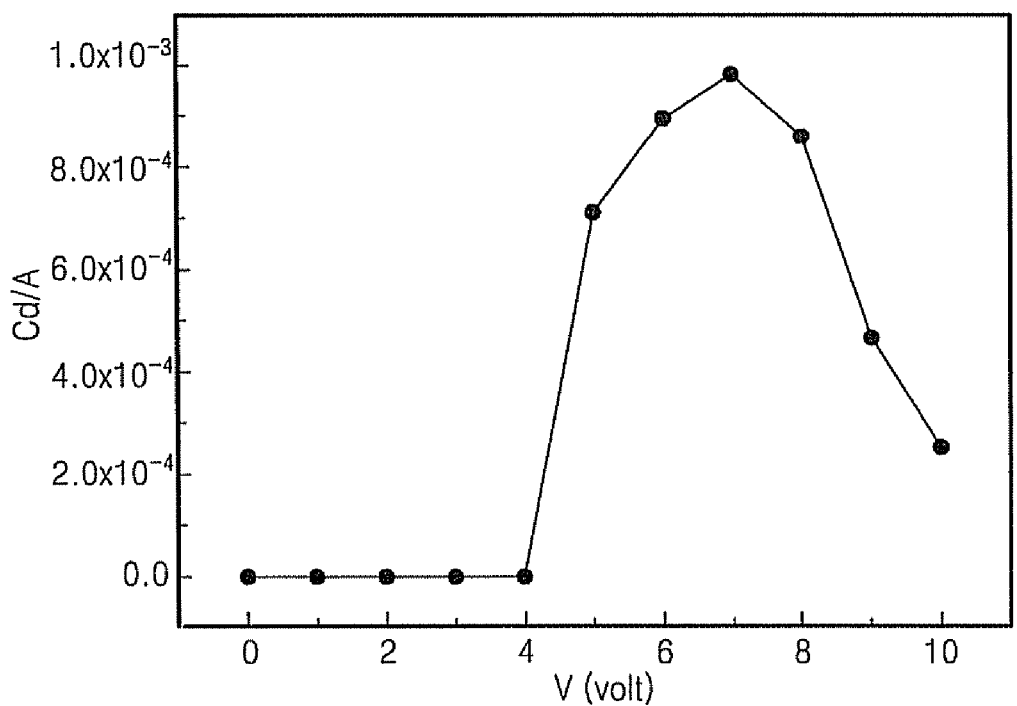

FIG. 8E illustrates a profile of luminescence brightness for unit current, and compares brightness levels achieved when predetermined currents pass at different bias voltages.

Figure 9A:
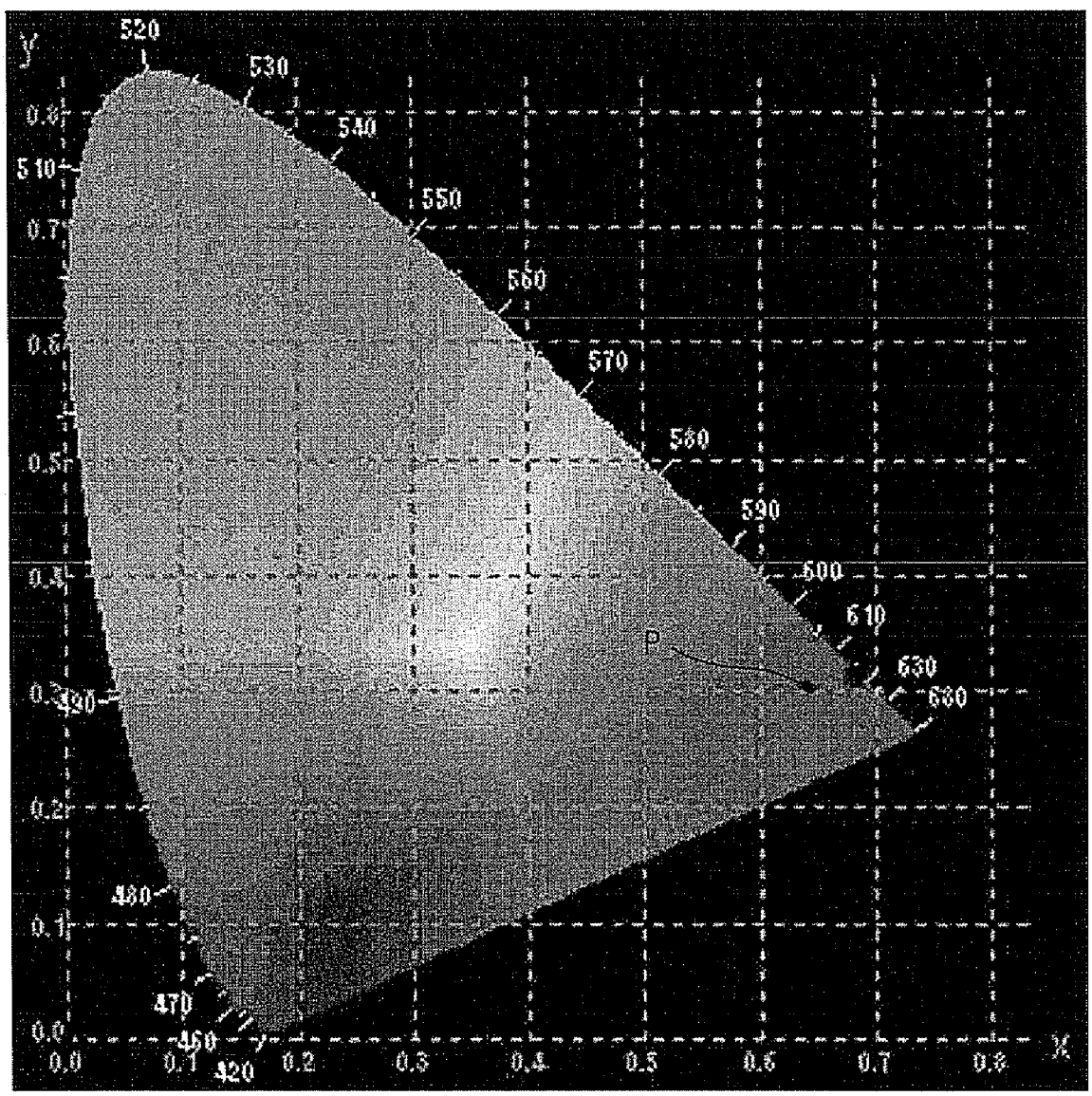
FIGS. 9A through 9E are views illustrating luminescence characteristics of an electroluminescence device according to an embodiment of the present invention.
Figure 9B:
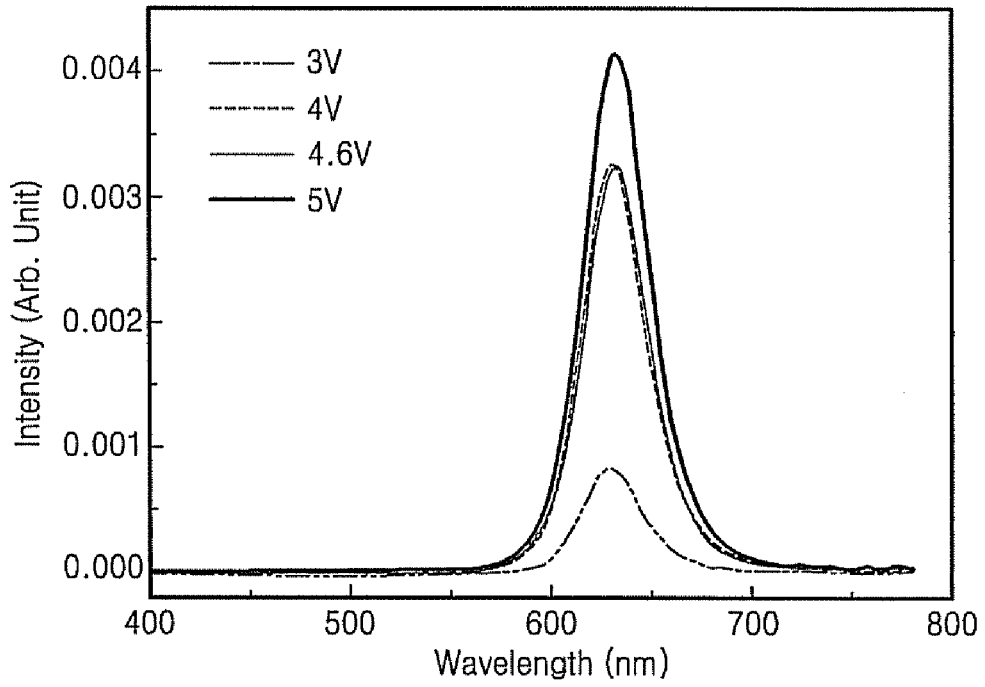

The luminescence brightness is rapidly increased at a voltage higher than the turn-on voltage, and the brightness for unit current is maximum when about 7V of bias voltage is applied, and it has a value of about $1.0 \times 10^{-3}$ Cd/A. This means that an operating efficiency reaches a maximum level when about 7V of bias voltage is applied FIGS. 9A through 9E are views illustrating luminescence characteristics of an electroluminescence device according to an embodiment of the present invention, in which PPV is employed as a hole transfer layer instead of PEDOT in the embodiments illustrated in FIGS. 8A through 8E. As illustrated in FIGS. 9A and 9B, the light radiated from the electroluminescence device is focused in the red light region around 650 nm, and the light of other wavelength ranges shows very low intensities.

Figure 9C:
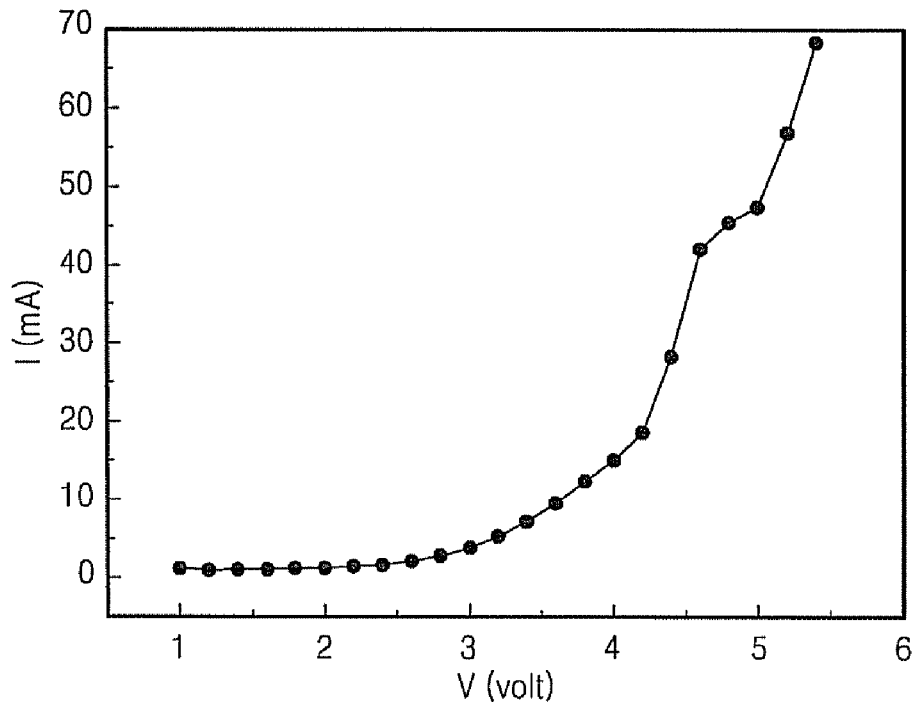
Figure 9D:
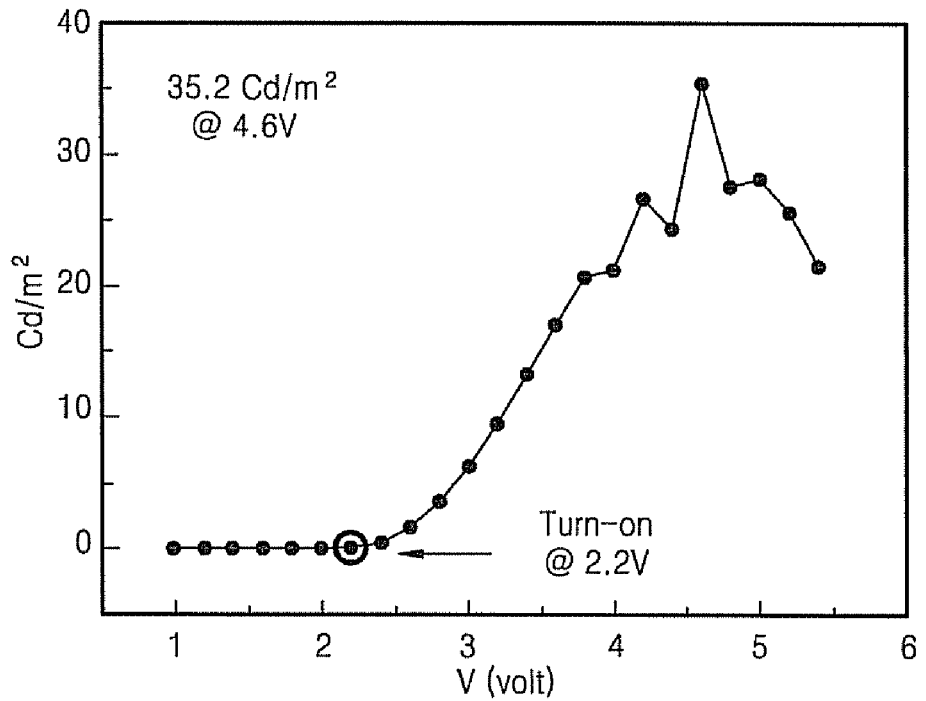
Figure 9E:
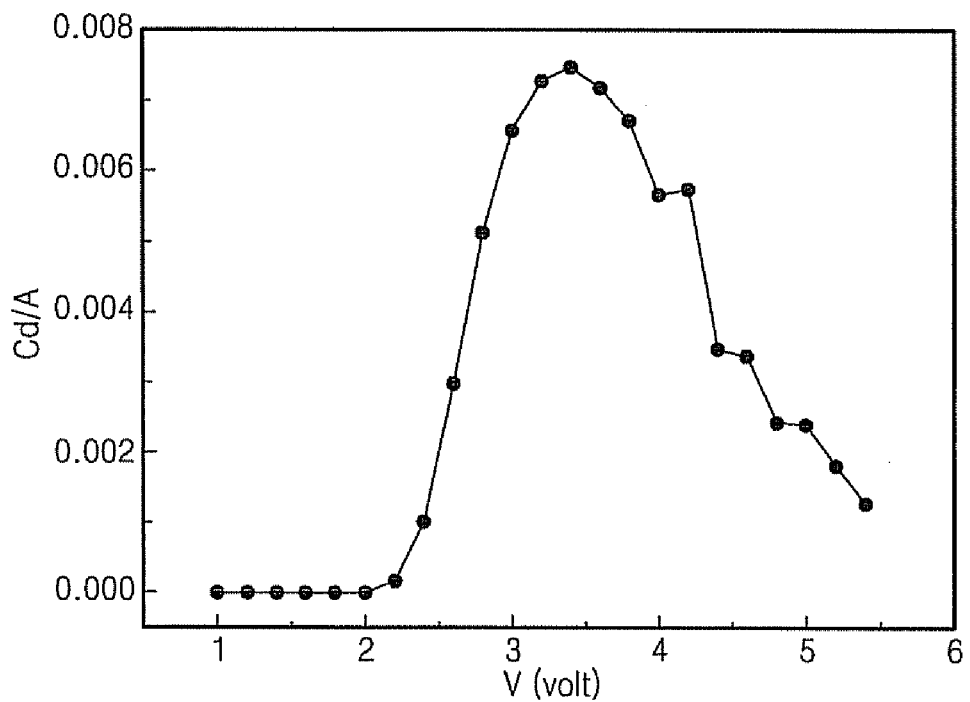

Referring to a current-voltage curve (I/V curve) of FIG. 9C illustrating operating characteristics of the electroluminescence device, it shows a turn-on voltage of about 2.2 V, which is about 55% compared to about 4V of the embodiment of FIGS. 8A through 8E. Further, as shown in a luminescence brightness curve of FIG. 9D, it shows the maximum brightness of 35.2Cd/m$^2$ at about 4.6V, and the maximum brightness is increased by 50 times compared to the maximum brightness of 0.7 Cd/m$^2$ in the embodiments of FIGS. 8A through 8E. Without being limited to theory, it is believed that one reason that the luminescence device of the embodiment employing PPV as a hole transfer layer shows a low turn-on voltage and a high luminescence brightness compared to those of the luminescence device of the embodiment of FIGS. 8A through 8E employing PEDOT is because of the difference of energy band structures of PPV and PEDOT. This will be explained later. FIG. 9E illustrates a luminescence brightness for unit current, and it is acknowledged that the maximum operating efficiency is shown at about 3.5 V.

Figure 10:
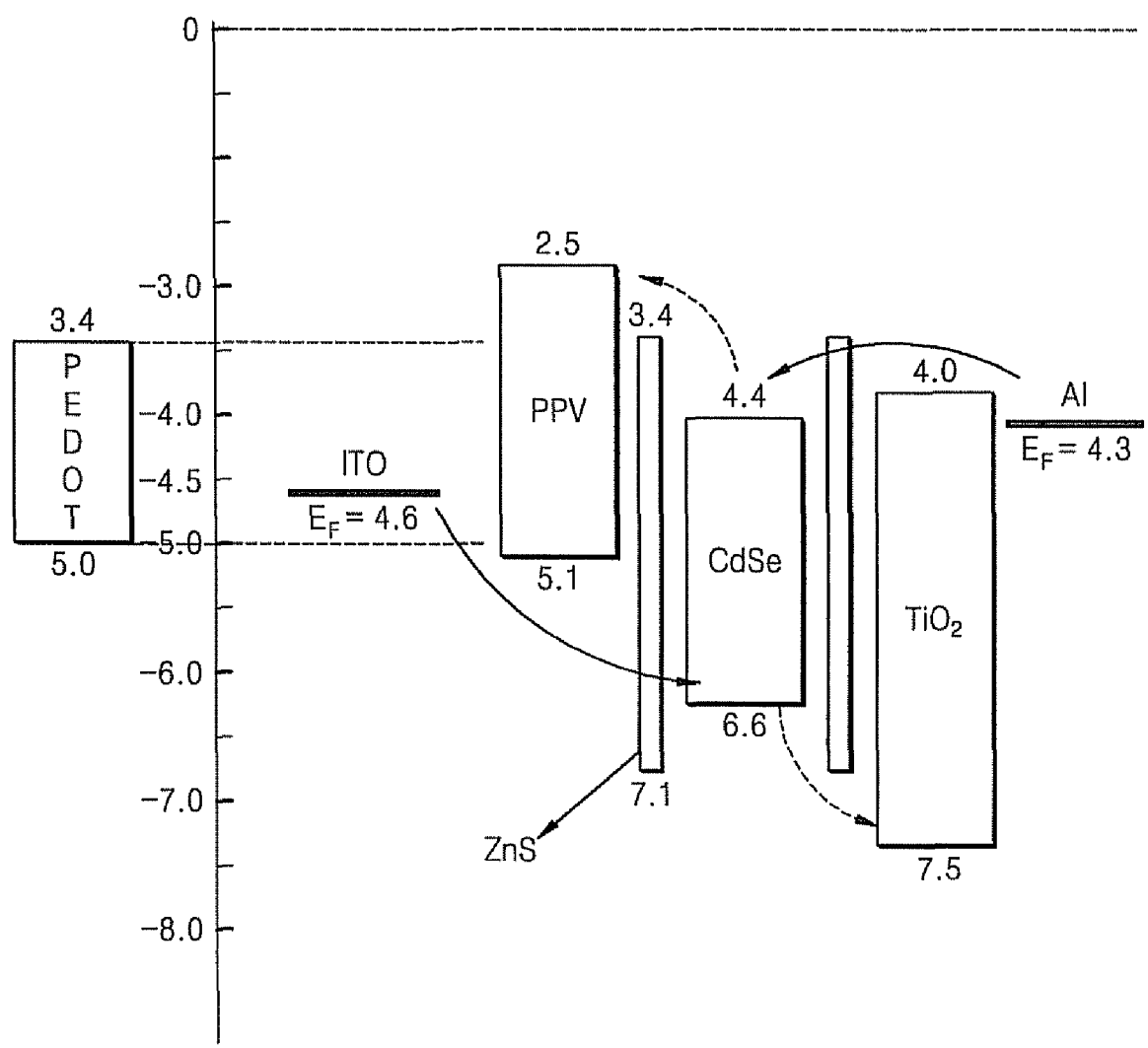
FIG. 10 is a diagram illustrating the band structure according to embodiments of the present invention.

FIG. 10 illustrates a band structure of the luminescence device composed of PPV or PEDOT as the hole transfer layer, a quantum dot luminescence layer, and amorphous TiO$_2$ as an electron transfer layer. In order to effectively operate the quantum dot electroluminescence device, hole injection from a first electrode (anode, ITO) to a quantum dot luminescence layer, and hole injection from a second electrode (cathode, Al) to a quantum dot luminescence layer must be easily performed. In the embodiment, PPV is used as a hole transfer layer and TiO$_2$ is used as an electron transfer layer. Since the amorphous TiO$_2$ is formed using a wet chemical process it is stable to air and moisture, and therefore offers great stability when compared with devices where vacuum-evaporation of single molecules is conducted to form the electron transfer layer. The luminescence device must have conditions of a low hole injection barrier and a low electron injection barrier for the effective functioning of the luminescence device. As illustrated in FIG. 10, a difference between Fermi level of the anode (ITO) electrode and the lower end of the band gap of PPV, corresponding to a hole injection barrier, is 0.5 eV, and a difference between Fermi level of a cathode (Al) electrode and a band gap upper end of TiO2, corresponds to an electron injection barrier is 0.3 eV. They thus show a low hole injection barrier and electron injection barrier. For effective quantum dot luminescence effect, holes and electrons injected from the anode electrode and the cathode electrode must be effectively recombined in the quantum dot luminescence layer. For the luminescence phenomenon by the effective hole-electron recombination at the quantum dot, a structure of confining the injected holes and electrons to the quantum dot effectively is required, and for this purpose, the hole transfer layer must function as an electron shield layer effectively, and the electron transfer layer must function as a hole shield layer effectively.

Thus, a difference between a band gap upper end of a hole transfer layer material (for example, 2.5 eV in the case of PPV) and Fermi level of anode electrode (ITO) must be great, and the band gap upper end of the hole transfer layer material must be much higher than a band gap upper end of an electron transfer layer material (for example, 4.0 eV in the case of TiO2). As illustrated in FIG. 10, when comparing the band gap upper end of PPV with the band gap upper end of PEDOT, since the band gap upper end of PPV is higher than the band gap upper end of PEDOT by 0.9 eV, a more effective electron shield effect can be expected, and since hole-electron recombination occurs in the quantum dot luminescence layer effectively, it is acknowledged that it has a high luminescence efficiency. Further, a difference between the band gap lower end of the electron transfer layer (for example, 7.5 eV in the case of TiO$_2$) and the cathode electrode Al must be great, and the band gap lower end of the electron transfer layer (for example, 7.5 eV in the case of TiO$_2$) must be much lower than the band gap lower end of the hole transfer layer (for example, 5.1 eV in the case of PPV). As illustrated in FIG. 10, the hole transfer layer and the electron transfer layer of the embodiment of the present invention are composed of the materials having a low hole/electron injection barrier and a high electron/hole shield effect, and the luminescence phenomenon by hole-electron recombination occurs effectively in the quantum dot luminescence layer.

According to the quantum dot electroluminescence device and the method of fabricating the same, effects can be achieved as follows.

First, the chemical and mechanical stability of the quantum dot thin film can be ensured by the cross-link agent treatment for the quantum dot luminescence layer, and a wet film formation process can be performed after the quantum dot luminescence layer is formed. Thus, since the electron transfer layer formed on the quantum dot luminescence layer can be formed using a relatively simple wet chemical process at room temperature and under atmospheric pressure the manufacturing processes can be simplified and costs can be reduced. In addition, the material of the electron transfer layer can be selected from various material groups. Further, since the stability of the quantum dot luminescence layer is improved, various processes such as thermal treatment for improving thin film characteristics can be employed if necessary.

Second, the thin film interface, which greatly influences on the characteristics of the device, can be maintained uniform and stable by cross-linking of the quantum dot luminescence layer, and the absence of voids in the quantum dots upon cross-linking. Thus, the generation of micro-shorts through the voids can be avoided thereby improving the luminescence brightness and the operating efficiency.

Third, the quantum dots can be arranged by close-packing because of the cross-linking. In addition, the binding force between interlayers can be increased. Further, injection of charge carriers can be easily performed, so as to decrease a turn-on voltage and facilitate an operating stability.

Fourth, the recrystallization by harmful materials such as oxygen, moisture, and the like, can be significantly reduced thus, the deterioration of the luminescence characteristics with time can be minimized.

Fifth, the turn-on voltage of the electroluminescence device is low and thus, power consumption can be reduced.

Sixth, since the resistivity to foreign harmful materials such as oxygen/moisture, and the like is increased, additional shield structures to protect them are not necessary. This is particularly useful when a soft flexible material is used to manufacture the electro luminescence device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a quantum dot electroluminescence device comprising:
    forming an anode electrode on an insulating substrate;
    forming a hole transfer layer composed of p-type polymer semiconductor on the anode electrode;
    two-dimensionally arraying synthesized quantum dots on the hole transfer layer to form a quantum dot luminescence layer;
    applying a cross-link agent to the quantum dot luminescence layer so as to cross-link the quantum dots and improve a chemical stability of the quantum dot luminescence layer;
    performing a wet chemical process on the quantum dot luminescence layer so as to form an electron transfer layer; and
    forming a cathode electrode on the electron transfer layer, wherein the cross-linking comprises supplying the quantum dot luminescence layer into a solution including the cross-link agent and heating under an inert gas ambient to maintain for a predetermined time,
    wherein the electron transfer layer is formed by a wet-processed thin film formation which includes coating on top of the quantum dot luminescent layer with a precursor solution including a precursor material and an organic solvent wherein the precursor material is organo-titanate or organo-zirconate, and performing a thermal curing treatment.

2. The method of claim 1, wherein the cross-link agent comprises chain organic molecules selected from diaminoalkane, dithiol, and dicarboxylate having amine functional group (—$NH_2$), thiol (—SH), and carboxyl functional group (—COO—) at both ends of the chain.

3. The method of claim 1, wherein the hole transfer layer comprises at least one or more polymer material selected from the group consisting of PEDOT (poly(3,4-ethylenedioxythiophene)), PSS (poly(4-styrenesulfonate)), PPV (poly(p-phenylene vinylenes)), MEH-PPV, and PVK (poly(9-vinlycarbazole)).

4. The method of claim 3, wherein the polymer hole transfer layer is formed by coating the top of the first electrode with a solution including a precursor material, and performing a thermal curing treatment.

5. The method of claim 1, wherein the electron transfer layer is composed of amorphous $TiO_2$ or $ZrO_2$.

6. The method of claim 1, wherein the quantum dots are formed by a wet chemical process supplying at least one or more precursor material into an organic solvent, and synthesizing quantum dots coordinate-bonded by the organic solvent to have confined growth size.

7. A method of fabricating a quantum dot electroluminescence device comprising:
    forming an anode electrode on an insulating substrate;
    forming a hole transfer layer composed of p-type polymer semiconductor on the anode electrode;
    two-dimensionally arraying synthesized quantum dots on the hole transfer layer to form a quantum dot luminescence layer;
    applying a cross-link agent comprising chain organic molecules selected from the group consisting of diaminoalkane and dicarboxylate, having amine functional groups (—$NH_2$) or carboxyl functional groups (—COO—) at both ends of the chain, to the quantum dot luminescence layer so as to cross-link the quantum dots and improve a chemical stability of the quantum dot luminescence layer;
    performing a wet chemical process on the quantum dot luminescence layer so as to form an electron transfer layer; and
    forming a cathode electrode on the electron transfer layer, wherein the cross-linking comprises supplying the quantum dot luminescence layer into a solution including the cross-link agent under an inert gas ambient to maintain for a predetermined time,
    wherein the electron transfer layer is formed by a wet-processed thin film formation which includes coating on top of the quantum dot luminescent layer with a precursor solution including a precursor material and an organic solvent wherein the precursor material is organo-titanate or organo-zirconate, and performing a thermal curing treatment.

* * * * *